(12) United States Patent
Tokuda et al.

(10) Patent No.: US 7,009,239 B2
(45) Date of Patent: Mar. 7, 2006

(54) VERTICAL SEMICONDUCTOR DEVICE AND MANUFACTURING METHOD THEREOF

(75) Inventors: Norifumi Tokuda, Tokyo (JP); Tadaharu Minato, Tokyo (JP); Mitsuru Kaneda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 27 days.

(21) Appl. No.: 10/834,110

(22) Filed: Apr. 29, 2004

(65) Prior Publication Data

US 2005/0029568 A1 Feb. 10, 2005

(30) Foreign Application Priority Data

Aug. 8, 2003 (JP) ............................. 2003-289881
Nov. 28, 2003 (JP) ............................. 2003-398726

(51) Int. Cl.
*H01L 27/108* (2006.01)
(52) U.S. Cl. ..................... 257/302; 257/330; 257/335; 257/347; 257/331; 257/332; 257/513
(58) Field of Classification Search ................ 257/330, 257/331, 332, 335, 347, 513
See application file for complete search history.

(56) References Cited

U.S. PATENT DOCUMENTS

| 4,976,532 A | 12/1990 | Nyman ........................ 351/158 |
| 5,065,212 A | 11/1991 | Ohata et al. |
| 5,626,268 A | 5/1997 | Kolton et al. .................. 223/85 |
| 6,642,600 B1 * | 11/2003 | Narazaki et al. ............ 257/513 |
| 2002/0130362 A1 | 9/2002 | Park |

FOREIGN PATENT DOCUMENTS

| EP | 1 227 522 A2 | 7/2002 |
| EP | 1 267 415 A2 | 12/2002 |
| JP | 2001-185727 | 7/2001 |
| JP | 2002-319676 | 10/2002 |

OTHER PUBLICATIONS

Patent Abstracts of Japan, JP 2001-185727, Jul. 6, 2001.

* cited by examiner

*Primary Examiner*—Mai-Huong Tran
(74) *Attorney, Agent, or Firm*—Oblon, Spivak, McClelland, Maier & Neustadt, P.C.

(57) ABSTRACT

A semiconductor device includes an n-type semiconductor substrate (1) including a p-type collector layer (2) formed in a second main surface side thereof, a trench (13) is formed in a peripheral portion of the semiconductor substrate (1) so as to surround the inside and reach the collector layer (2) from a first main surface of the semiconductor substrate (1), and a p-type isolation region (14) formed by diffusion from a sidewall of the trench (13) is provided to be connected to the collector layer (2). The trench (13) is filled with a filling material (16).

6 Claims, 6 Drawing Sheets

F I G . 1 3
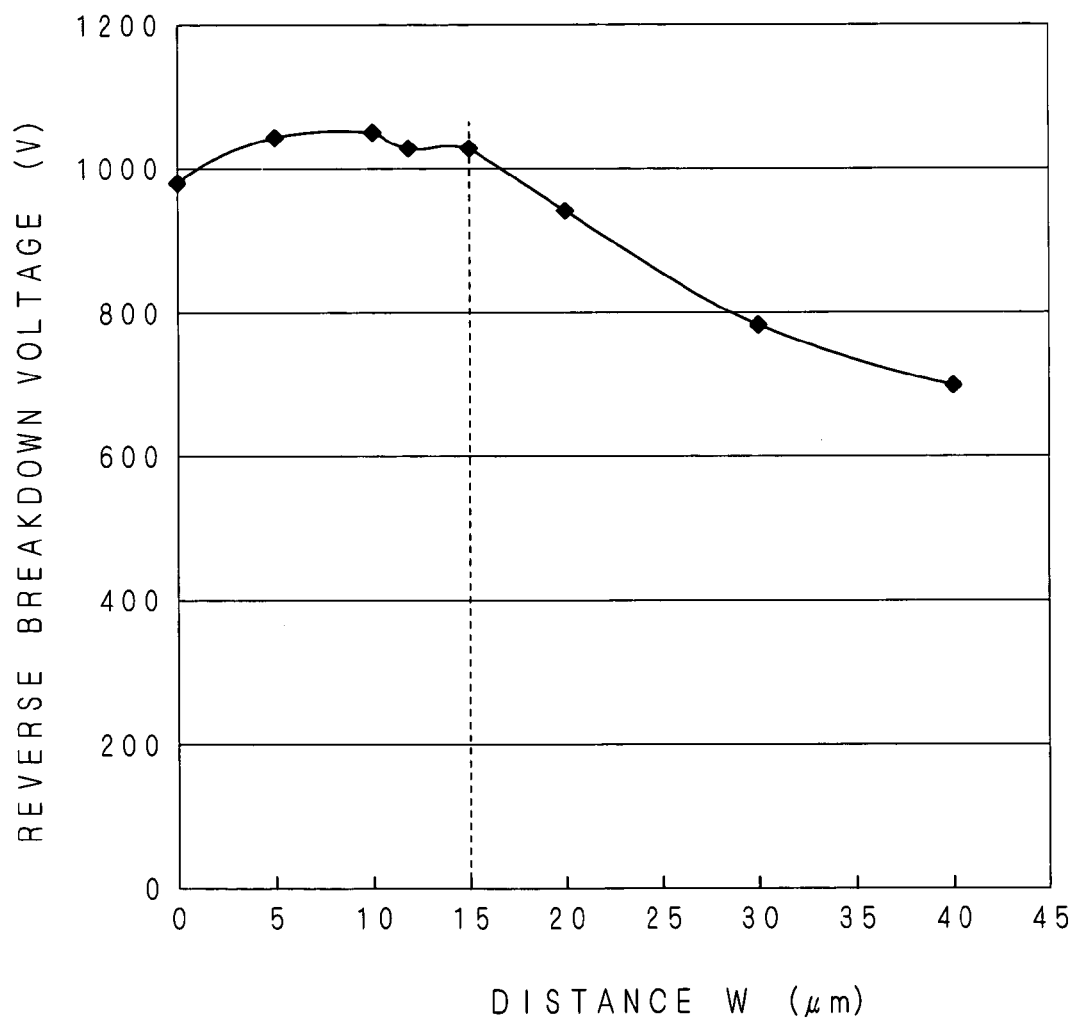

VERTICAL SEMICONDUCTOR DEVICE AND MANUFACTURING METHOD THEREOF

BACKGROUND OF THE INVENTION

1. Field of the Invention

The present invention relates to a semiconductor device such as an IGBT (Insulated Gate Bipolar Transistor) having a bidirectional breakdown voltage and a manufacturing method thereof, and more particularly to a peripheral breakdown voltage structure in the semiconductor device.

2. Description of the Background Art

In recent years a power conversion circuit, the so-called AC matrix converter, which is switched on and off directly by a bidirectional switch has been proposed to be used in a semiconductor power conversion device. And a semiconductor device having a bidirectional breakdown voltage has been called for as the bidirectional switch used in the AC matrix converter.

One conventional example of such semiconductor device is a reverse blocking IGBT as illustrated in FIG. 1 of Japanese Patent Application Laid-Open No. 2002-319676 (pages 7 to 8, FIG. 1). This kind of reverse blocking IGBT, however, requires a p+ region obtained by diffusing boron to a depth of 120 μm in an oxygen atmosphere at a temperature of 1200° C. or more to lie on the periphery of a chip in order to maintain a reverse breakdown voltage, and thus needs a long-diffusion process. Besides, horizontal diffusion of the boron causes the p+ region to spread over a chip surface to the almost same degree as the diffusion depth, resulting in a considerable reduction in utilization efficiency of the chip surface.

In order to address those problems, Japanese Patent Application Laid-Open No. 2001-185727 (page 7, FIG. 15) proposes a reverse blocking IGBT having such a structure as shown in FIG. 15(c). This IGBT provides an inclined trench in a portion corresponding to the p+ region of the IGBT disclosed in the aforementioned publication using side etching by isotropic wet etching to form a positive bevel structure, and introduces an impurity by diffusion from a wall surface of the trench to provide p+ regions. While this IGBT eliminates the need for a long-diffusion process as in the IGBT disclosed in the aforementioned publication, it does need a trench width in accordance with the inclination because the trench needs to be inclined. This too has considerably reduced utilization efficiency of a chip surface.

The terminal structures disclosed in the Japanese Patent Application Laid-Open Nos. 2002-319676 and 2001-185727 both require a considerable area of the chip to form the structure for maintaining the reverse breakdown voltage, resulting in a considerable reduction in utilization efficiency of the chip surface. This has caused an increase in chip size, which in turn has increased the chip cost.

SUMMARY OF THE INVENTION

It is an object of the present invention to obtain a vertical semiconductor device including a terminal structure capable of improving utilization efficiency of a chip area while maintaining a reverse breakdown voltage.

According to the present invention, a vertical semiconductor device includes a semiconductor substrate, a first impurity region, a trench and a second impurity region. The semiconductor substrate includes a first main surface and a second main surface opposed to the first main surface and is of a first conductivity type. The semiconductor substrate further includes an element region and a peripheral region provided so as to surround the element region. The first impurity region is formed inside the semiconductor substrate so as to be exposed at the second main surface, and has a higher impurity concentration higher than the first conductivity type of the semiconductor substrate. The trench is provided in the peripheral region and has an almost vertical sidewall with reference to the first main surface. The second impurity region is formed along the sidewall of the trench inside of the semiconductor substrate in a prescribed thickness, and is of a second conductivity type electrically connected to the first impurity region. A ratio d/w (aspect ratio) between a depth d and an opening width w of the trench is 5 or more and 10 or less.

This produces the effect of improving utilization efficiency of a chip area while obtaining a stabilized reverse breakdown voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a graph showing a relation between a distance W and a reverse breakdown voltage between a collector electrode and an emitter electrode.

DESCRIPTION OF THE PREFERRED EMBODIMENTS

First Preferred Embodiment

Figure 1:
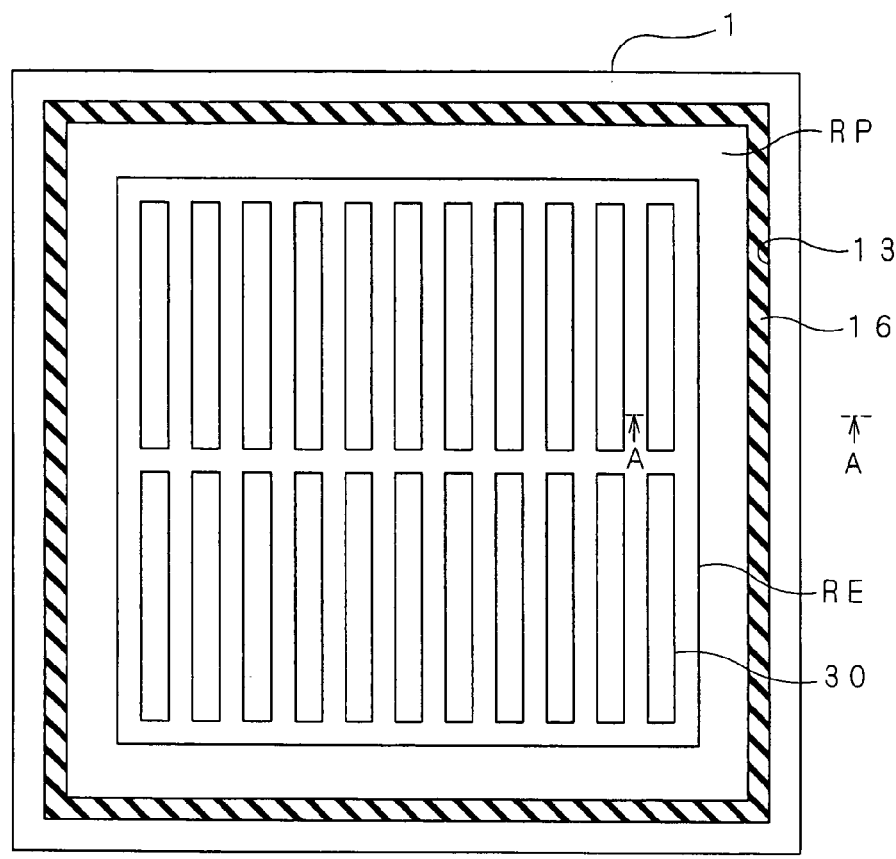
FIG. 1 is a plan view of a semiconductor device according to a first preferred embodiment of the present invention.
Figure 2:
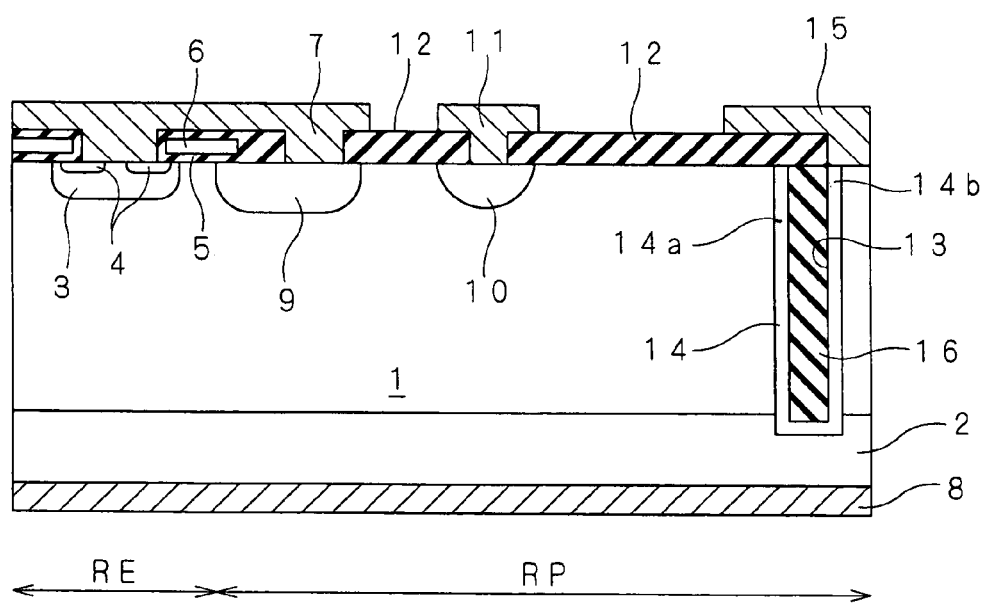
FIG. 2 is a sectional view of an essential part in the semiconductor device according to the first preferred embodiment of the invention.

FIGS. 1 and 2 illustrate configurations of a reverse blocking IGBT having a breakdown voltage of 600V according to a first preferred embodiment. FIG. 1 is a plan view of a chip used in the reverse blocking IGBT and FIG. 2 is a sectional view taken along the line A–A' on a peripheral portion of the chip. An n-type silicon substrate 1 includes parallel and opposed first and second main surfaces, and a p-type collector layer 2 (first impurity region) of a high concentration is provided to form a PN junction with the silicon substrate 1 by introducing a p-type impurity e.g., boron from the second main surface side. A collector electrode 8 is formed on the p-type collector layer 2.

A central portion of the chip in FIG. 1 is an element region RE, which is filled with a plurality of IGBT cells 30 and is responsible for a main operation of the IGBT. A peripheral region RP is provided to surround the element region RE. In FIG. 2, a p-type base region 3 is formed in the semiconductor substrate 1 so as to be partially exposed at the first main surface. N-type emitter regions 4 are formed in the p-type base region 3 so as also to be partially exposed at the first main surface. A gate electrode 6 made of polycrystalline silicon is provided through a gate insulating film 5 made of silicon dioxide on the exposed portions of the base region 3 between the semiconductor substrate 1 and the emitter region 4. Further, an emitter electrode 7 is provided on the first main surface so as to make electrical contact with the base region 3 and the emitter regions 4. Each IGBT cell 30 consists of the p-type base region 3, the n-type emitter regions 4, the gate insulating film 5, the gate electrode 6, the emitter electrode 7, the silicon substrate 1, the p-type collector layer 2 and the collector electrode 8. In the peripheral region RP so formed as to surround the element region RE, a peripheral base region 9, a guard ring 10 and a guard ring electrode 11 are formed to partially constitute the peripheral region RP. An insulating film 12 is formed on the first main surface covering the peripheral region RP for protective purposes. The peripheral region RP is responsible for maintaining the breakdown voltage of the IGBT.

A trench 13 is formed in an outer edge portion of the peripheral region RP so as to reach the p-type collector layer 2 from the first main surface of the silicon substrate 1. As can be seen from the plan view of the chip shown in FIG. 1, the trench 13 is arranged continuously so as to surround the element region RE. Between sidewalls of the trench 13, the one close to the element region RE is called a first sidewall, and the other one far from the element region RE is called a second sidewall hereafter. While the trench 13 surrounds the element region RE to form a square in FIG. 1, the trench 13 may surround the element region RE to form another shape as required, by rounding corner portions of the square, for example. In the reverse blocking IGBT of 600V according to the first preferred embodiment, a depth of the PN junction between the semiconductor substrate 1 and the p-type collector layer 2 from the first main surface is approximately 100 µm. Accordingly, a depth of the trench 13 needs to be 100 µm or more. In the first preferred embodiment, the depth of the trench 13 is set to be 110 µm.

A p-type isolation region 14 (second impurity region) of about 5 µm thickness is formed along wall surfaces of the trench 13. At this time, p-type isolation regions 14a and 14b are formed on the first and second sidewalls sides of the trench 13, respectively. The mere "p-type isolation region 14" mentioned in the present specification includes both the p-type isolation regions 14a and 14b on the first and second sidewalls sides, respectively. The trench 13 including the p-type isolation region 14 is filled with a filling material 16. Since the depth of the trench 13 is set to reach the collector layer 2, the p-type isolation region 14 is electrically connected to the collector layer 2. It is required that a p-type impurity concentration of the p-type isolation region 14 be $1 \times 10^{14}$ atoms/cm$^3$ or more, preferably $1 \times 10^{15}$ atoms/cm$^3$ or more, in surface concentration at an interface with the filling material 16. When the surface concentration is less than $1 \times 10^{14}$ atoms/cm$^3$, the application of a negative voltage V with respect to the emitter electrode 7, namely a reverse voltage, to the collector electrode 8 causes a depletion layer generated at the time of voltage application to reach an inner wall of the trench 13, bringing about a state close to punch-through, and as a result, the IGBT loses the capability of maintaining the prescribed breakdown voltage. A field plate 15 made of aluminum is provided on the first main surface to make contact with the p-type isolation region 14. While filling the trench 13 is not necessarily needed, it is desirable that the filling material 16 should be formed by filling the trench 13 with some material in order to avoid contamination stemming from residues of a resist and the like used in a wafer process. In the first preferred embodiment, silicon dioxide is used for the filling material 16 because of its high deposition rate. Considering stress of the filling material 16 to be applied to the silicon substrate 1, however, it is further desirable to use a material having a slower deposition rate yet an approximate modulus of thermal expansion to the silicon substrate, i.e., molybdenum, tungsten or polycrystalline silicon, or a composite of those materials.

Figure 3:
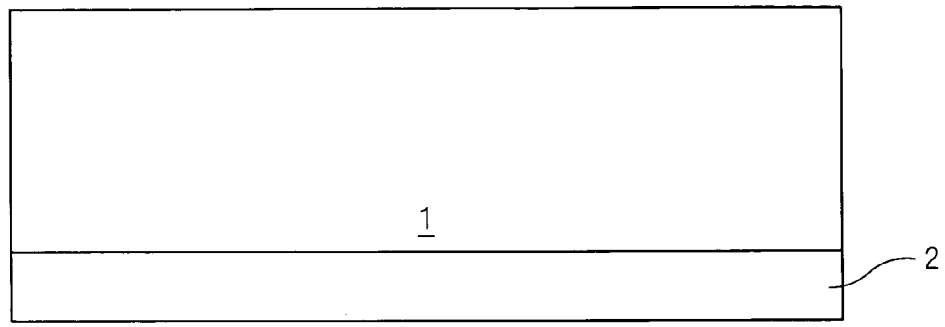
FIGS. 3 to 7 are sectional views of manufacturing steps of the essential part in the semiconductor device according to the first preferred embodiment of the invention.
Figure 4:
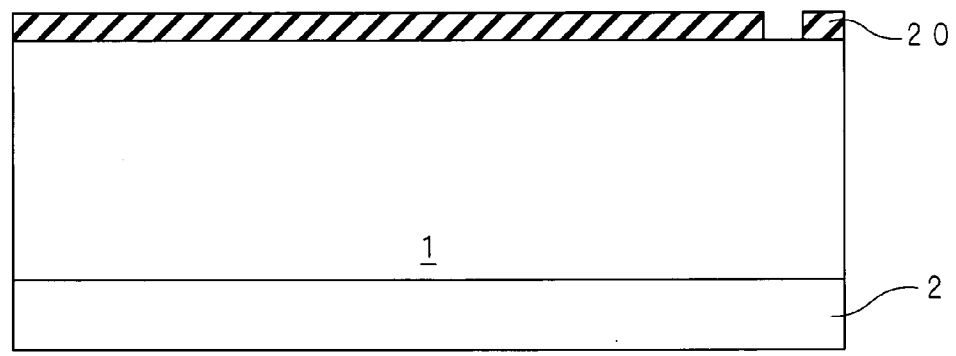

The reverse blocking IGBT mentioned above is manufactured as explained hereafter. In the silicon substrate 1 including the first and second main surfaces and doped uniformly with an n-type impurity e.g., phosphor, a p-type impurity e.g., boron is introduced from the second main surface to entirely form the p-type collector layer 2 (FIG. 3). Then, a TEOS film 20 is deposited as a mask material on the first main surface of the silicon substrate 1, and a prescribed opening is formed in the TEOS film 20 using photolithography (FIG. 4). The TEOS film is a silicon dioxide film formed by CVD with TEOS (Tetra Ethyl Ortho Silicate) as a silicon source.

Figure 5:
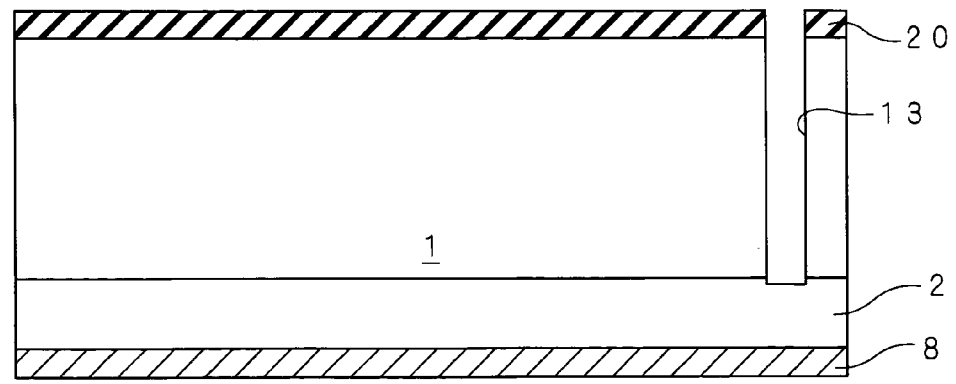

Next, the trench 13 having the prescribed depth and opening width is so formed as to reach the p-type collector layer 2 from the first main surface of the silicon substrate 1 by anisotropic etching using the opening (FIG. 5). In the first preferred embodiment, the trench 13 is set to be 110 µm deep. When a trench that deep is formed by isotropic etching such as normal wet etching, a trench width inevitably extends twice as much as the trench depth to almost 200 µm due to side etching on both sides. On the other hand, in the first preferred embodiment, the trench 13 is formed by anisotropic etching e.g., ICP (Inductive Coupled Plasma) etching. Therefore, the opening width reaches as small as approximately 3 µm in the first preferred embodiment. The ICP etching is capable of forming a trench with an aspect ratio of up to approximately 100, the aspect ratio being a ratio d/w between a trench depth d and a trench opening width w. The aspect ratio of the first preferred embodiment is approximately 40 (the opening width is approximately 2.75). An opening width may be set to be 20 µm or less when the aspect ratio of 5 is or larger, which means that the opening width may be narrowed to be approximately one-tenth part of that when isotropic etching is used.

Figure 6:
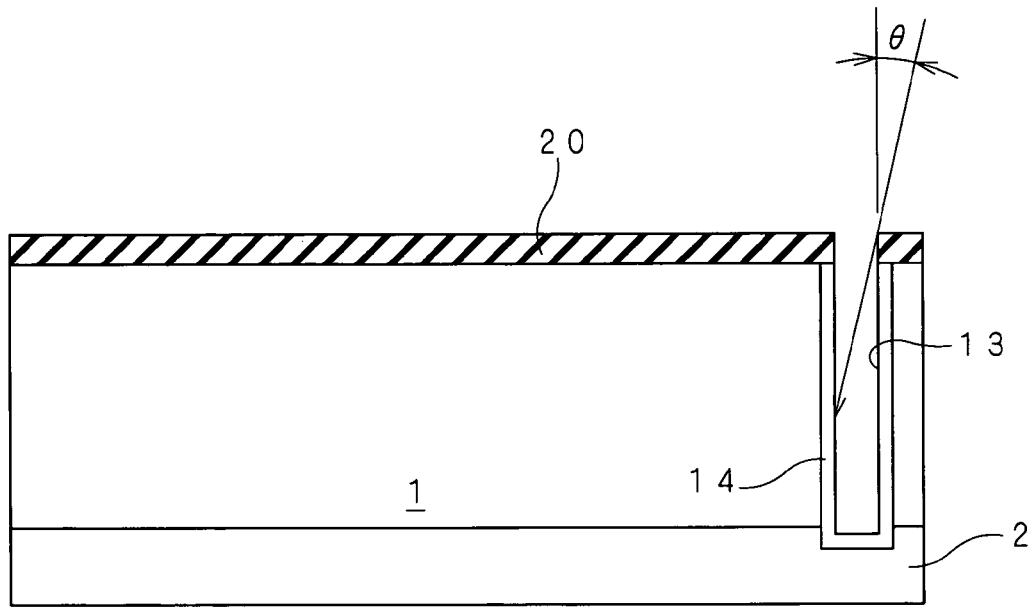

Next, ion implantation and subsequent diffusion by annealing are performed through the opening while leaving the TEOS film 20 as it is, to introduce boron the p-type impurity from the trench sidewall, thereby forming the p-type isolation region 14 having the prescribed thickness from the trench sidewall surface in the silicon substrate 1 around the trench 13 (FIG. 6). The ion implantation is performed by an oblique ion implantation method which implants ions at a certain angle θ inclined with reference to the normal (line) of the first main surface. By implanting boron by the oblique ion implantation method while rotating the silicon substrate 1 with the normal of the first main surface as a rotation axis, a prescribed dose of boron can be introduced into the sidewalls on both sides of the trench 13. Though the p-type isolation region 14 may be formed by a coating diffusion method or a gas diffusion method instead of the above ion implantation diffusion method, when applied to form a trench having a small opening and a great depth as in the first preferred embodiment, the coating diffusion method and the gas diffusion method present a problem such that it is hard to provide the impurity atoms to as far as the bottom of the trench and thus a uniform impurity concentration becomes unobtainable. The first preferred embodiment, which employs the ion implantation diffusion method, obtains the p-type isolation region 14 of a uniform impurity concentration without presenting such problem. Particularly, when a tangent of the incident angle θ of the ion implantation, i.e., tan θ, is set to be smaller than or equal to the inverse of the ratio (aspect ratio) between the depth and opening width of the trench, the impurity ions are applied to as far as the bottom of the trench, and a uniform concentration distribution can be obtained across the whole trench sidewalls.

Figure 7:
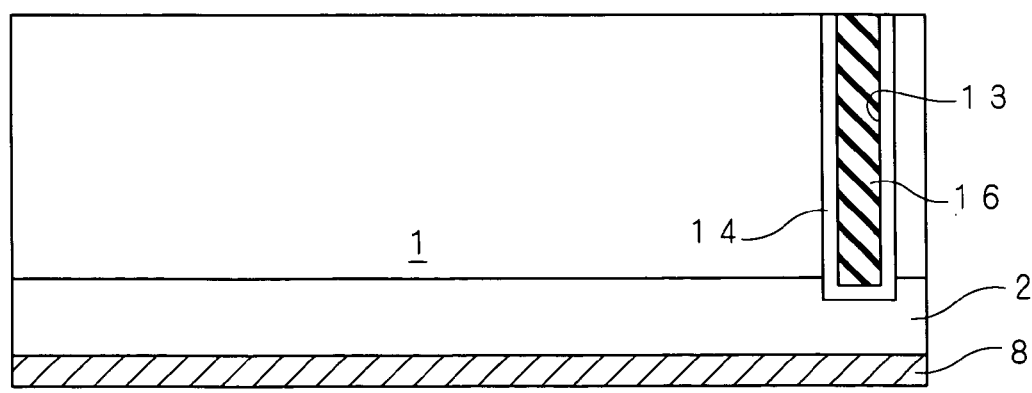

Next, silicon dioxide is deposited entirely on the first main surface of the semiconductor substrate 1 by CVD so as to completely fill the trench, after the TEOS film 20 is removed. The silicon dioxide deposited over the first main surface is then removed by etching such that the silicon oxide remains only in the trench. Consequently, the filling material 16 made of silicon dioxide is completed in the trench (FIG. 7). The filling material 16 may be similarly formed of polycrystalline silicon or a metal such as molybdenum and tungsten, or a composite of those materials.

Finally, the base region 3, the emitter regions 4, the gate insulating film 5, the gate electrode 6, the emitter electrode 7, the collector electrode 8, the peripheral base region 9 and others are formed by a well-known manufacturing method of an IGBT cell, completing the reverse blocking IGBT according to the first preferred embodiment.

The operation of the reverse blocking IGBT will now be described. When a positive voltage V with respect to the emitter electrode 7, namely a forward voltage, is applied to the collector electrode 8 of the IGBT, a depletion layer generated around a PN junction between the peripheral base region 9 and the semiconductor substrate 1 is extended toward the semiconductor substrate 1 side, allowing a forward breakdown voltage to be maintained. At this time, an electric field is intensified near the ends of the peripheral base region 9 where the radius of curvature of the PN junction is small, yet it is relieved because of the existence of the guard ring 10.

When a negative voltage V with respect to the emitter electrode 7, namely a reverse voltage, is applied to the collector electrode 8 of the IGBT, a depletion layer generated around the PN junction between the collector layer 2 and the semiconductor substrate 1 is extended toward the semiconductor substrate 1 side, allowing a reverse breakdown voltage to be maintained. At this time, a depletion layer is also generated around a PN junction between the p-type isolation region 14 continuous with the collector layer 2 and the semiconductor layer 1, yet it is extended only toward the semiconductor substrate 1 side and not extended up to an outer edge of the chip outside the p-type isolation region 14. This prevents an electric field from being developed up to a dicing line at the outer edge of the chip, thereby stabilizing the reverse breakdown voltage. However, it is feared that the depletion layer generated around the PN junction between the p-type isolation region 14 and the semiconductor layer 1 is slightly extended to the inside of the p-type isolation region 14 to make contact with the field plate 15, leading to deterioration of the breakdown voltage. For this reason, it is desirable that the electrical contact between the p-type isolation region 14 and the filed plate 15 be made at an exposed portion at the first main surface of the p-type isolation region 14b on the second sidewall side of the trench 13 far from the element region RE, rather than an exposed portion at the first main surface of the p-type isolation region 14a on the first sidewall side of the trench 13 close to the element region RE, as in the first preferred embodiment.

The p-type isolation region 14 is formed by impurity diffusion from the sidewall of the trench that is formed on the peripheral portion of the chip by anisotropic etching. Therefore, a proportion of the p-type isolation region 14 occupying the chip area can be reduced, improving utilization efficiency of the chip surface.

Figure 8:
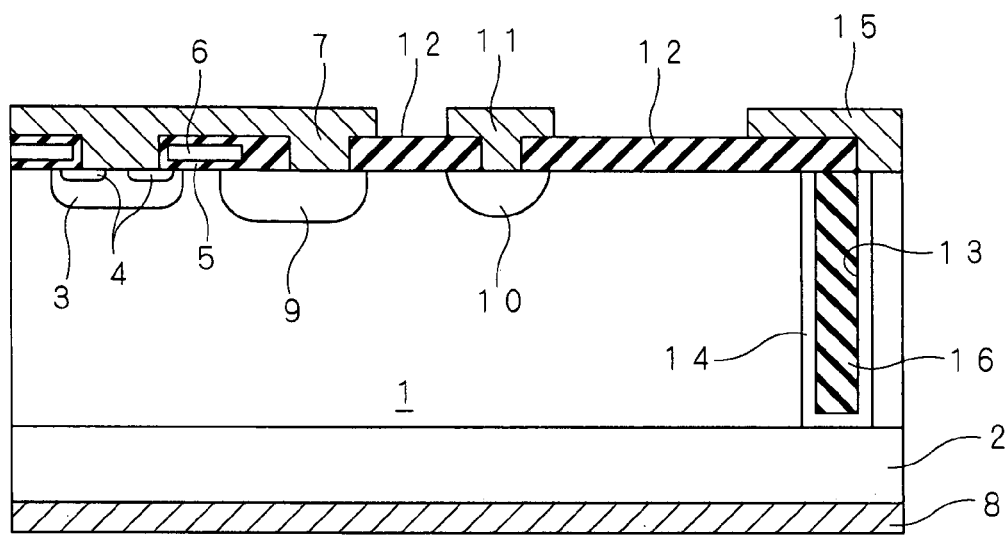
FIG. 8 is sectional view of an essential part in a semiconductor device according to a modification of the first preferred embodiment of the invention.

Although the trench 13 is so formed as to reach the collector layer 2 in the first preferred embodiment, it is essential only that the p-type isolation region 14 and the collector layer 2 be connected and have the same potential in order to attain the object of the present invention. Thus a modification of the present invention is given as illustrated in FIG. 8. The trench 13 in FIG. 8 is identical to that in FIG. 2 except that the bottom thereof does not reach the collector layer 2. Namely, the depth of the PN junction between the semiconductor substrate 1 and the p-type collector layer 2 from the first main surface is approximately 100 μm and the depth of the trench 13 is set to be 95 μm. The p-type isolation region 14 formed along the wall surfaces of the trench 13 has a thickness of approximately 5 μm, so that the p-type isolation region 14 and the collector layer 2 are electrically connected to each other. Needless to say, the modification illustrated in FIG. 8 produces similar functions and effect. Further, since the trench 13 is shallower in the modification in FIG. 8, the occurrence of crystal defects resulting from the stress by the filling material 16 to be filled in the trench 13 is suppressed in the semiconductor substrate 1. Additionally, the thickness of the semiconductor substrate 1 after the trench 13 has been formed can be ensured to a sufficient degree, so that mechanical strength of the semiconductor substrate 1 can be ensured, preventing damage at the time of handling.

Second Preferred Embodiment

Figure 9:
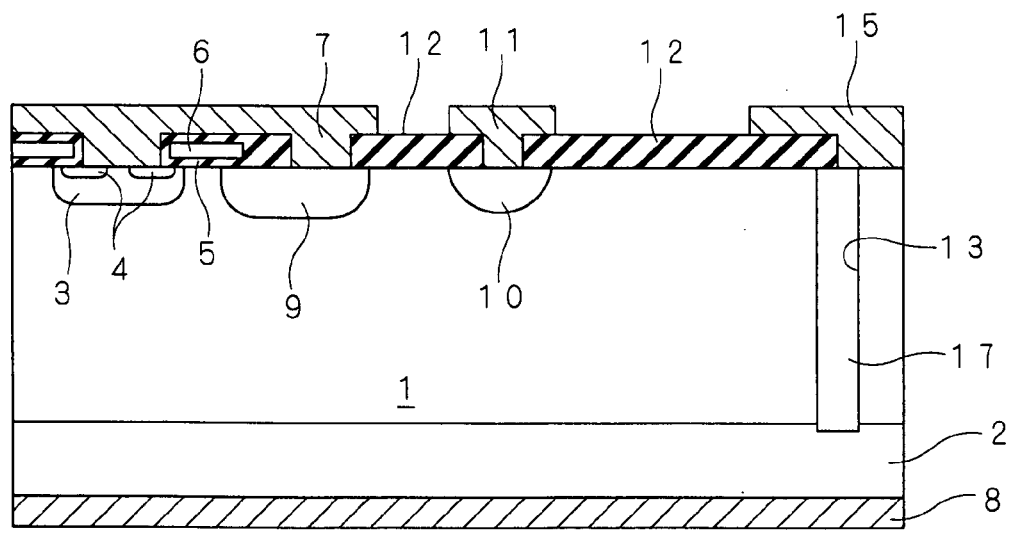
FIG. 9 is a sectional view of an essential part in a semiconductor device according to a second preferred embodiment of the invention.

FIG. 9 illustrates a configuration of a reverse blocking IGBT according to a second preferred embodiment. A plan view of a chip is identical to that of FIG. 1 according to the first preferred embodiment, and FIG. 9 is a sectional view taken along the line A–A' on the peripheral portion of the chip. This configuration is different from that of FIG. 2 according to the first preferred embodiment in that the p-type isolation region 14 is omitted and silicon doped with a p-type impurity (e.g. boron) is used as a filling material 17 instead. Consequently, the filling material 17 servers the functions of the p-type isolation region 14 in the first preferred embodiment. Therefore, a reverse blocking IGBT having the same effect as in the first preferred embodiment yet being more simply configured can be obtained without providing an additional p-type isolation region.

The manufacturing method in the second preferred embodiment is omitted here because it is identical to that in the first preferred embodiment except that the step of forming the p-type isolation region 14 is omitted. Depending on the thermal process condition in a subsequent step to the step of forming the filling material 17, the p-type impurity included in the filling material 17 may diffuse into the semiconductor substrate 1 to form a p-type diffusion layer around the trench 13, achieving the same structure as that of the first preferred embodiment. Needless to say, this produces the beneficial effect as in the first preferred embodiment in term of simplifying the manufacturing method by omitting the step of forming the p-type isolation region 14.

Third Preferred Embodiment

Figure 10:
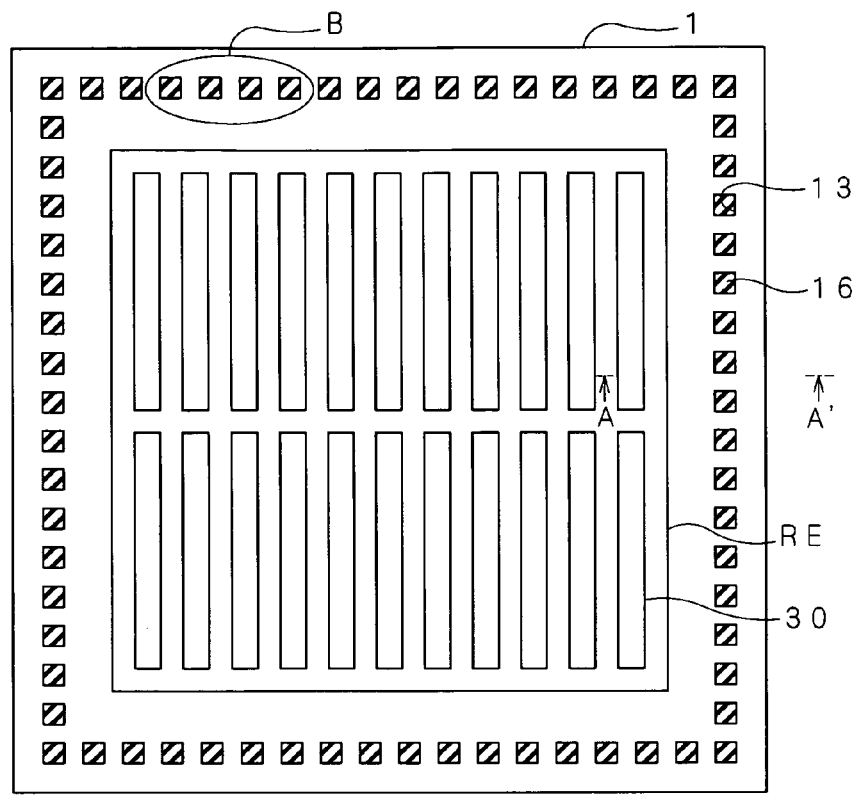
FIG. 10 is a plan view of a semiconductor device according to a third preferred embodiment of the invention.
Figure 11:
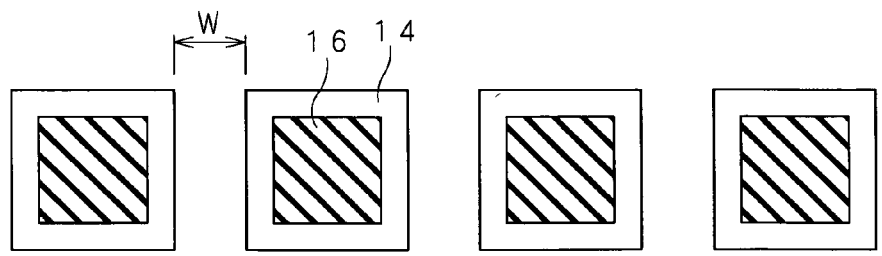
FIG. 11 illustrates one example of a portion B in FIG. 10 in an enlarged manner.
Figure 12:
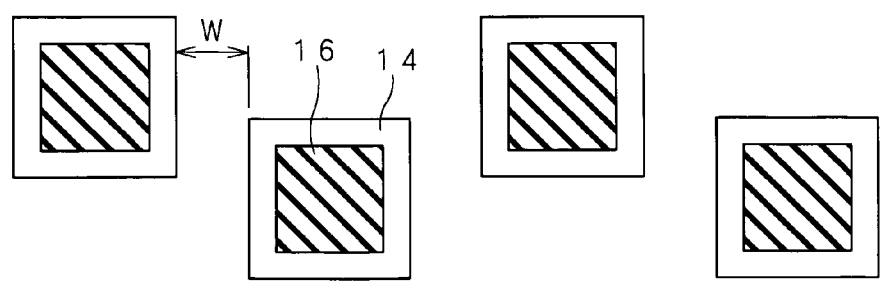
FIG. 12 illustrates another example of the portion B in FIG. 10 in an enlarged manner.

As burying back the trench 13 with the filling material 16 of some kind as in the first preferred embodiment causes crystal defects resulting from the stress by the filling material 16 to occur in the semiconductor substrate 1 and exerts a bad influence on the characteristics of the semiconductor device, it is desirable to minimize the volume of the filling material. A third preferred embodiment has been invented to address this issue. FIG. 10 is a plan view of a chip used in a reverse blocking IGBT having a breakdown voltage of 600V according to the third preferred embodiment. A sectional view taken along the line A–A' on the peripheral portion of the chip is identical to that of FIG. 2 and is thus omitted. FIGS. 11 and 12 are views illustrating a portion B in FIG. 10 in an enlarged manner. FIG. 11 shows one example and FIG. 12 another. The trench 13, which is provided on the peripheral region as a single trench so as to continuously surround the element region RE in FIG. 1, is provided as a plurality of trenches so as to intermittently surround the element region RE in FIG. 10. As can be seen from FIG. 11 showing the portion B in FIG. 10 in an enlarged manner or also from FIG. 12, the p-type isolation regions 14 are formed around the sidewalls of the plurality of the trenches and the adjacent p-type isolation regions 14 are separated by a distance W. By surrounding the element region RE with the dotted intermittent trenches as shown in FIG. 10, the volume of the filling material 16 is reduced and the occurrence of crystal defects is suppressed as compared with the case shown in FIG. 1 where the element region RE is surrounded by the continuous trench, thereby exerting a favorable influence on the characteristics of the IGBT.

It is needless to say that such intermittent trenches produce the similar functions and effect as in the first preferred embodiment as long as the p-type isolation regions 14 are eventually connected. The third preferred embodiment, where the adjacent p-type isolation regions 14 are separated by the distance W and the distance W has a sufficiently small value, also produces the similar functions and effect as in the first preferred embodiment. Namely, when a negative voltage V with respect to the emitter electrode 7, namely a reverse voltage, is applied to the collector electrode 8 of the IGBT with the distance W having the sufficiently small value, each of depletion layers generated around PN junctions between the plurality of the p-type isolation regions 14 continuous with the collector layer 2 and the semiconductor substrate 1 depletes the semiconductor substrate 1 between the plurality of the p-type isolation regions 14 with a relatively low voltage level. Those depletion layers are extended only toward the element region RE side in the semiconductor substrate 1 even when the voltage level is increased afterward. Accordingly, a high voltage is not applied up to the outer edge of the chip outside the p-type isolation regions 14. This prevents an electric field from being developed up to the dicing line at the outer edge of the chip, thereby stabilizing the reverse breakdown voltage. The bigger the distance W, the smaller the volume of the filling material 16 and less occurrence of crystal defects. FIG. 13 shows a permissible range of the distance W.

FIG. 13 is a graph showing a relation between the distance W of the p-type isolation regions 14 and a reverse breakdown voltage between a collector electrode and an emitter electrode. The vertical axis indicates a reverse breakdown voltage between a collector electrode and an emitter electrode of an IGBT and the horizontal axis indicates the distance W. In obtaining the relation shown, the p-type isolation regions 14 are formed on conditions of boron implantation at 50 KeV and at $1\times10^{15}$ atoms/cm$^2$ and an annealing process for 30 minutes at 1215° C., the distance W is divided from 0 to 40 $\mu$m, device structure data is prepared with a process simulator called tsuprem4, and then a breakdown voltage of each structure is calculated by a calculator based on the structure data with a device simulator called Medici. FIG. 13 indicates a sharp decrease in the reverse breakdown of the IGBT after the distance W reaches more than 15 $\mu$m. Therefore, we learn that the IGBT should be designed with the distance W smaller than or equal to 15 $\mu$m.

In the above-preferred embodiments, the vertical semiconductor devices are defined as a reverse blocking IGBT, and the first and second conductivity types are defined as n-type and p-type, respectively. Meanwhile, the functions and effect remain unchanged with the reversed conductivity types.

While the invention has been shown and described in detail, the foregoing description is in all aspects illustrative and not restrictive. It is therefore understood that numerous modifications and variations can be devised without departing from the scope of the invention.

What is claimed is:

1. A vertical semiconductor device comprising:
   a semiconductor substrate of a first conductivity type including a first main surface and a second main surface opposed to said first main surface, said semiconductor substrate including an element region and a peripheral provided so as to surround said element region;
   a first impurity region of a second conductivity type having a higher impurity concentration than said first conductivity type of said semiconductor substrate, formed inside said semiconductor substrate so as to be exposed at said second main surface;
   a trench provided in said peripheral region and having an almost vertical sidewall with reference to said first main surface; and
   a second impurity region of said second conductivity type formed along said sidewall of said trench inside of said semiconductor substrate in a prescribed thickness and electrically connected to said first impurity region, wherein
   a ratio d/w (aspect ratio) between a depth d and an opening width w of said trench is 5 or more and 100 or less.

2. The vertical semiconductor device according to claim 1, further comprising a filling material filled in said trench.

3. The vertical semiconductor device according to claim 1, wherein
   said trench is formed continuously so as to surround said element region and includes a first sidewall close to said element region and a second sidewall far from said element region, and
   said second impurity region includes second impurity regions on said first sidewall side and said second sidewall side which are formed in a prescribed thickness from said first and second sidewalls to the inside of said semiconductor substrate, respectively,
   said vertical semiconductor device further comprising:
   a field plate in electrical contact with said second impurity region on said second sidewall side.

4. A vertical semiconductor device comprising:
   a semiconductor substrate of a first conductivity type including a first main surface and a second main surface opposed to said first main surface, said semiconductor substrate including an element region and a peripheral region provided so as to surround said element region;
   a first impurity region of a second conductivity type having a higher impurity concentration than said first conductivity type of said semiconductor substrate, formed inside said semiconductor substrate so as to be exposed at said second main surface;

a trench provided in said peripheral region to reach said first impurity region from said first main surface and having an almost vertical sidewall with reference to said first main surface; and a filling material filled in said trench and being made of a semiconductor material of said second conductivity type.

5. A vertical semiconductor device comprising:

a semiconductor substrate of a first conductivity type including a first main surface and a second main surface opposed to said first main surface, said semiconductor substrate including an element region and a peripheral region provided so as to surround said element region;

a first impurity region of a second conductivity type having a higher impurity concentration than said first conductivity type of said semiconductor substrate, formed inside said semiconductor substrate so as to be exposed at said second main surface;

a plurality of trenches provided in said peripheral region so as to surround said element region with a prescribed distance therebetween; and a plurality of second impurity regions of said second conductivity type formed along sidewalls of said plurality of said trenches inside of said semiconductor substrate in a prescribed thickness and electrically connected to said first impurity region, respectively.

6. The vertical semiconductor device according to claim 5, wherein a distance between said plurality of said second impurity regions is 15 $\mu$m or less.

* * * * *